(12) United States Patent
Strachan et al.

(10) Patent No.: US 11,289,162 B2
(45) Date of Patent: Mar. 29, 2022

(54) ANALOG CONTENT ADDRESSABLE MEMORY UTILIZING THREE TERMINAL MEMORY DEVICES

(71) Applicant: HEWLETT PACKARD ENTERPRISE DEVELOPMENT LP, Houston, TX (US)

(72) Inventors: John Paul Strachan, Palo Alto, CA (US); Catherine Graves, Palo Alto, CA (US); Can Li, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/862,997

(22) Filed: Apr. 30, 2020

(65) Prior Publication Data

US 2021/0343341 A1 Nov. 4, 2021

(51) Int. Cl.
*G11C 15/04* (2006.01)

(52) U.S. Cl.
CPC ................ *G11C 15/046* (2013.01)

(58) Field of Classification Search
CPC .................................... G11C 15/046
USPC ....................................... 365/49.17
See application file for complete search history.

(56) References Cited

U.S. PATENT DOCUMENTS

| | | | |
|---|---|---|---|
| 6,442,090 B1 | 8/2002 | Ahmed et al. | |
| 6,985,372 B1 | 1/2006 | Blyth et al. | |
| 7,554,844 B2 | 6/2009 | Werner et al. | |
| 8,654,555 B2 | 2/2014 | Shin et al. | |
| 10,453,531 B1 | 10/2019 | Petti | |
| 2014/0092664 A1 | 4/2014 | Bourianoff et al. | |
| 2016/0049198 A1 | 2/2016 | Darla et al. | |
| 2016/0358654 A1 | 12/2016 | Holst et al. | |
| 2018/0330791 A1* | 11/2018 | Li | G11C 14/0072 |

(Continued)

OTHER PUBLICATIONS

Afuye, O. et al., "Modeling and Circuit Design of Associative Memories With Spin-Orbit Torque FETs," IEEE Journal on Exploratory Solid-State Computational Devices and Circuits, Nov. 8, 2019, vol. 5, No. 2, pp. 197-205, https://ieeexplore.ieee.org/document/8894388.

(Continued)

*Primary Examiner* — Min Huang
(74) *Attorney, Agent, or Firm* — Hewlett Packard Enterprise Patent Department

(57) ABSTRACT

An analog content addressable memory cell includes a match line, a high side, and a low side. The high side encodes a high bound on a range of values and includes a first three terminal memory device. The first three terminal memory device includes a first gate that sets a high voltage bound of the first three terminal memory device. Specifically, an input voltage applied at the first gate of the first memory device, if higher than the high voltage bound, turns the first memory device ON which discharges the match line. Similarly, the low side encodes a lower bound on a range of values and includes a second three terminal memory device. The second three terminal memory device includes a second gate that sets a low voltage bound of the second three terminal memory device. Specifically, an input voltage applied at the second gate of the second memory device, if lower than the low voltage bound, turns the first memory device ON which discharges the match line.

20 Claims, 5 Drawing Sheets

(56) References Cited

U.S. PATENT DOCUMENTS

| | | | |
|---|---|---|---|
| 2019/0080761 A1* | 3/2019 | Makosiej | G11C 13/025 |
| 2019/0325963 A1* | 10/2019 | Noack | G11C 15/046 |
| 2020/0075099 A1* | 3/2020 | Choi | G11C 11/1675 |
| 2020/0357470 A1* | 11/2020 | Noack | G11C 5/147 |

OTHER PUBLICATIONS

Bayat, F. M. et al., "Redesigning commercial floating-gate memory for analog computing applications," 2015 IEEE International Symposium on Circuits and Systems (ISCAS), https://web.ece.ucsb.edu/Faculty/selected_pubs/strukov/06_ISCASflash2015.pdf.

Chiao-Ying Huang, "Ternary Content-addressable Memory Circuits," 2012, pp. 1-7, IEEE.

Miles Rusch and Jan M. Rabaey, Ed., "The Design of an Analog Associative Memory Circuit for Applications in High-dimensional Computing," May 18, 2018, pp. 1-28, Technical Report No. UCB/EECS-2018-72, University of California at Berkeley, Berkeley, CA, USA.

Ni, K. et al., "Ferroelectric Ternary Content-addressable Memory for One-shot Learning," Nov. 18, 2019, https://www.nature.com/articles/s41928-019-0321-3.

Tan, A., "Experimental Demonstration of a Ferroelectric HfO2-Based Content Addressable Memory Cell," IEEE Electron Device Letters, Dec. 31, 2019, vol. 41, No. 2, pp. 240-243, https://ieeexplore.ieee.org/document/8946709.

Tomochika Harada et al., "A Content-addressable Memory Using "Switched Diffusion Analog Memory with Feedback Circuit"," Abstract, Dec. 2000, 1-page (online), Retrieved from the Internet on Feb. 13, 2019 at URL: <researchgate.net/publication/227035680_A_Content-Addressable_Memory_Using_Switched_Diffusion_Analog_Memory_with_Feedback_Circuit>.

Yin, X. et al., "FeCAM: A Universal Compact Digital and Analog Content Addressable Memory Using Ferroelectric," Apr. 4, 2020, arXiv preprint arXiv:2004.01866, https://arxiv.org/pdf/2004.01866.pdf.

* cited by examiner

US 11,289,162 B2

ANALOG CONTENT ADDRESSABLE MEMORY UTILIZING THREE TERMINAL MEMORY DEVICES

BACKGROUND

Content addressable memory ("CAM") is a type of computing memory in which the stored data is not accessed by its location but rather by its content. A word, or "tag", is input to the CAM, the CAM searches for the tag in its contents and, when found, the CAM returns the address of the location where the found contents reside. CAMs are powerful, efficient, and fast. However, CAMs are also relatively large, consume a lot of power, and are relatively expensive. These drawbacks limit their applicability to select applications in which their power, efficiency, and speed are sufficiently desirable to outweigh their size, cost, and power consumption.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

Figure 1:
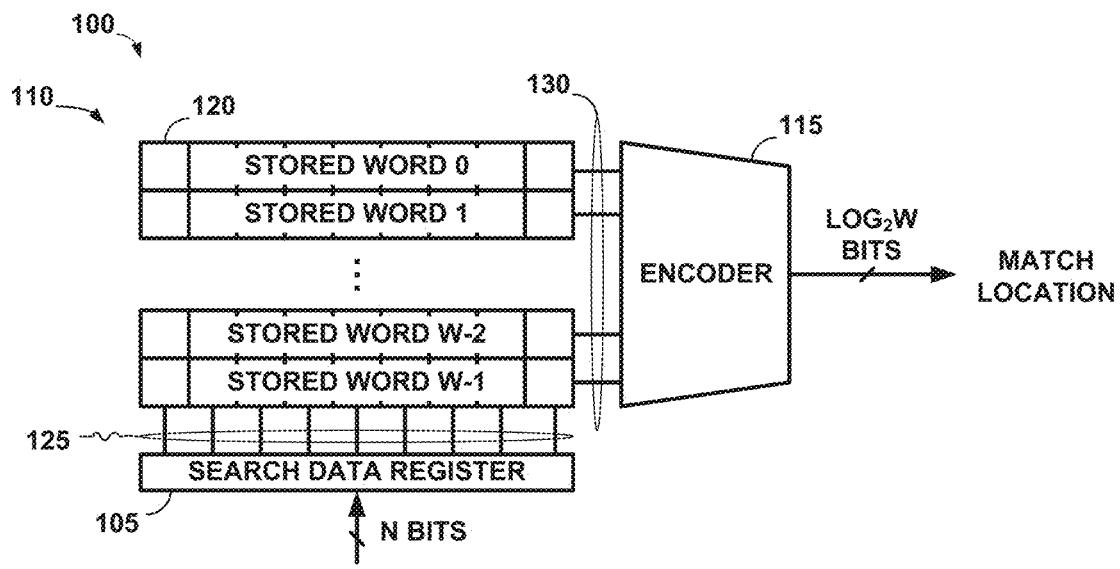
FIG. 1 depicts an analog content addressable memory ("analog CAM") in accordance with one or more examples of the subject matter claimed below.

While examples described herein are susceptible to various modifications and alternative forms, the drawings illustrate specific examples herein described in detail by way of example. It should be understood, however, that the description herein of specific examples is not intended to be limiting to the particular forms disclosed, but on the contrary, the intention is to cover all modifications, equivalents, and alternatives falling within the spirit and scope of the examples described herein and the appended claims.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Content addressable memory ("CAM") is a hardware that compares input patterns against its stored data. The memory that stores the data in the CAM also performs the search operation at the same location, eliminating the expensive data transfer between different units in conventional hardware. During the search, all the memory cells are operating in parallel, which leads to massive throughput with applications in real-time network traffic monitoring, access control lists ("ACL"), associative memories, etc.

CAMs can be implemented in technologies that permit the CAM to hold its contents even when power is lost or otherwise removed. Thus, a CAM's data "persists" and can act as what is known as a "non-volatile memory". These technologies include, for instance, resistive switching memory (i.e. memristor), phase change memory, magnetoresistive memory, ferroelectric memory, some other resistive random access memory device, or combinations of those technologies.

CAMs can be categorized as "binary" or "ternary". A binary CAM ("BCAM") operates on an input pattern containing binary bits of "0" and "1". A ternary CAM ("TCAM") operates on an input pattern (and stores data) containing not only binary bits of "0" and "1", but also an "X" value. An "X" is sometimes referred to as a "don't care" or a "wildcard". In a search on the input pattern in a TCAM, an "X" will return a match on either a "0" bit or a "1". Thus, a search on the input pattern "10X1" will return a match for both "1001" and "1011". Note that both BCAMs and TCAMS use and operate on binary values of "0" and "1". CAMs are digital in that the data are stored in the CAM as binary values in a memory (e.g., SRAM, memristor, etc.) and the input patterns are represented by binarized logic '0's and '1's. Each memory cell in the CAM processes one value at a time (either 0/1 or 0/1/X), which limits the memory density and the power efficiency.

The present disclosure provides an analog CAM ("aCAM") circuit having memory cells including at least one three terminal memory device. The three terminal memory device may be a non-volatile memory device that may, in some examples, be a three terminal transistor. The aCAM searches multilevel voltages and stores analog values in a non-volatile memory. One analog cell can implement a function that is equivalent to multiple digital CAM cells, leading to significant advantages in area and power saving in implementing certain CAM-based functions. The aCAM circuit can be driven with standard multi-level digital values, or directly with analog signals, giving additional potential for increased functionality while removing the need for expensive analog-digital conversion. More particularly, an aCAM cell outputs a match when the analog input voltage matches a certain range that is defined by the aCAM cell.

More particularly, an aCAM in accordance with the present disclosure can match all values between a "high voltage bound" and a "low voltage bound", or within a range, where the range includes non-binary values. These high and low values are set by programming three terminal memory devices of the aCAM, which may be referred to as $V_{high}$ and $V_{low}$ herein. $V_{high}$ and $V_{low}$ set bounds of the range of values that may be stored in the cell such that the cell may store analog values. A memory cell in an aCAM may store any value between the value defined by $V_{high}$ and the value defined by $V_{low}$. If $V_{high}=V_{max}$, where $V_{max}$ is the maximum programmable voltage of a three terminal memory device, and $V_{low}=V_{min}$, where $V_{min}$ is the minimum programmable voltage of a three terminal memory device, then the stored value is an "X", as in a Ternary CAM.

The high voltage bound and the low voltage bound, $V_{high}$ and $V_{low}$ respectively, may be set by shifting a gate voltage threshold of the programmable memory device as will be described in further detail below. One example of an aCAM includes a plurality of cells arranged in rows and columns. Each cell performs two analog comparisons: 'greater than' and 'less than' to the searched data line voltage at the same time, with significantly reduced processing time and energy consumption compared to its digital counterpart. The aCAM can be driven with standard multi-level digital values or directly with analog signals in various examples. This provides additional potential for increased functionality when removing the need for expensive analog-digital conversion. The significant power saving of the proposed memristor aCAM enables the application of CAMs to more generalized computation and other novel application scenarios.

Structurally, in the examples disclosed herein, each memory cell of the aCAM disclosed herein includes a "high side" that sets the high voltage bound and a "low side" that sets the low voltage bound. Each side of the cell includes a three terminal memory device. If there is a match, i.e. if a voltage applied to the three terminal memory device at the low side is higher than the low voltage bound and the voltage applied to the three terminal memory device at the high side is lower than the high voltage bound, then a match is indicated on a match line of the memory cell. Specifically, neither memory device activates (turns "ON") to discharge or pull down the match line. An aCAM includes an array of such cells, a search data register into which the input pattern is loaded, and an encoder that produces a match location from the match lines.

Note, however, that the structures shown herein by which the aCAM cells may be implemented are but illustrative means by which the aCAM cells may be implemented. Those skilled in the art having the benefit of this disclosure may realize other, alternative structures by which the disclosed functions of the aCAM cells may be performed. Accordingly, the subject matter claimed below includes not only those means disclosed herein, but also equivalent structures performing the disclosed functions.

Turning now to the drawings, the aCAM disclosed herein may be used in digital applications to perform traditional TCAM functions and operations as well as in analog applications. FIG. 1, discussed further below, illustrates one particular example of a digital application of the aCAM. FIG. 1 conceptually depicts an analog content addressable memory ("aCAM") 100 in accordance with one or more examples of the subject matter claimed below. The aCAM 100 is, in the example of FIG. 1, used in a digital application in which input search patterns and the values stored in the aCAM 100 are digital.

The aCAM 100 includes a search data register 105, an analog memory cell array 110, and an encoder 115. The analog cell array 110 stores W "stored words" 0 through W−1. Each stored word is a pattern of values, at least some of which may be analog values as described below. The search data register 105, in use, may be loaded with an analog or binary input pattern that can be searched for among the contents of analog cell array 110. The example of FIG. 1 operates on a binary input pattern as indicated by the 'n bits' going to the data line register. An example operating on an analog search pattern is discussed further below. Thus, instead of needing to store two bits of data in two columns as is the case for a digital CAM, one column of the aCAM cells can encode four analog values.

Figure 2:
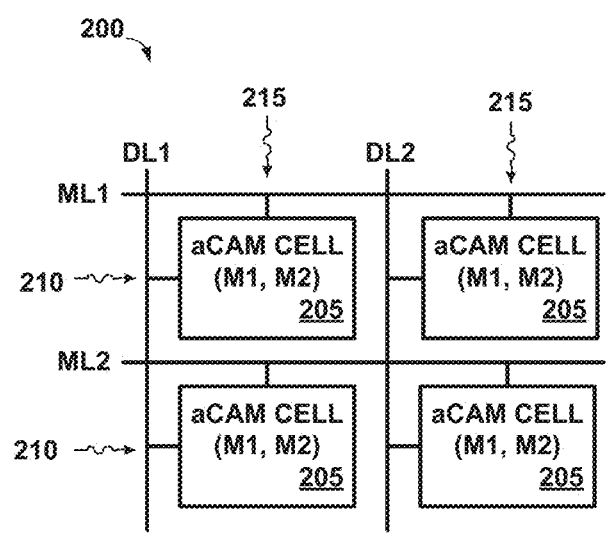
FIG. 2 illustrates selected portions of an analog cell array of an analog CAM such as the analog CAM in FIG. 1 in one particular example.

The analog cell array 110 includes a plurality of analog cells 120 (only one indicated) arranged in rows and columns as shown in FIG. 2 and discussed further below. During a search, the analog input pattern loaded into the search data register 105 is communicated to the analog cell array 110 over a plurality of search lines 125. Some examples may use data lines in addition to or in lieu of search lines. Each cell 120 then indicates whether a value of the analog input pattern is matched by a range of values contained in the cell 120, the range of values including non-binary values.

The indications of whether the cells contain matches are communicated to the encoder 115 over a plurality of match lines 130. Note that a match is found if the searched word (or pattern) matches the stored word within a single row. The match lines do not output the matches of individual cells, but whether the stored row word matches the searched data (row). More particularly, match lines 130 are pre-charged high along rows, data is searched on search lines 125 (or data lines) along columns, and if a mismatch between searched and stored content occurs, the 130 discharges and goes low. If a match occurs, the match line 130 stays high.

The encoder 115 is a priority encoder that returns a match location with the analog cell array 110. Note that the encoder 115 may be omitted in some examples, particularly in examples in which multiple match locations are identified and desired. For instance, because the "don't care" values may be included in the input pattern, multiple matches among the W stored words may be found. Some examples might wish to identify more than one, or even all, match locations and these examples would omit the encoder 115.

FIG. 2 illustrates selected portions of an analog cell array 200 of an aCAM such as the aCAM 100 in FIG. 1 in one particular example. The aCAM cells 205 are arranged in rows 210 and columns 215 and are each individually searchable over the data lines DL1, DL2. Whether a match is found from data on DL1 and DL2 and the data stored in the rows by each aCAM cell's $V_{high}$ and $V_{low}$ programmed values is indicated over the match lines ML1, ML2. As those in the art having the benefit of this disclosure will appreciate, an analog cell array 200 will typically be larger than a 2×2 array. The precise size will be implementation specific. The 2×2 portion is shown for illustrative purposes and is not limiting.

Each aCAM cell 205 includes two memory devices M1, M2 (not separately shown) that are used to define the range of values stored in the respective aCAM cell 205.

Figure 3:
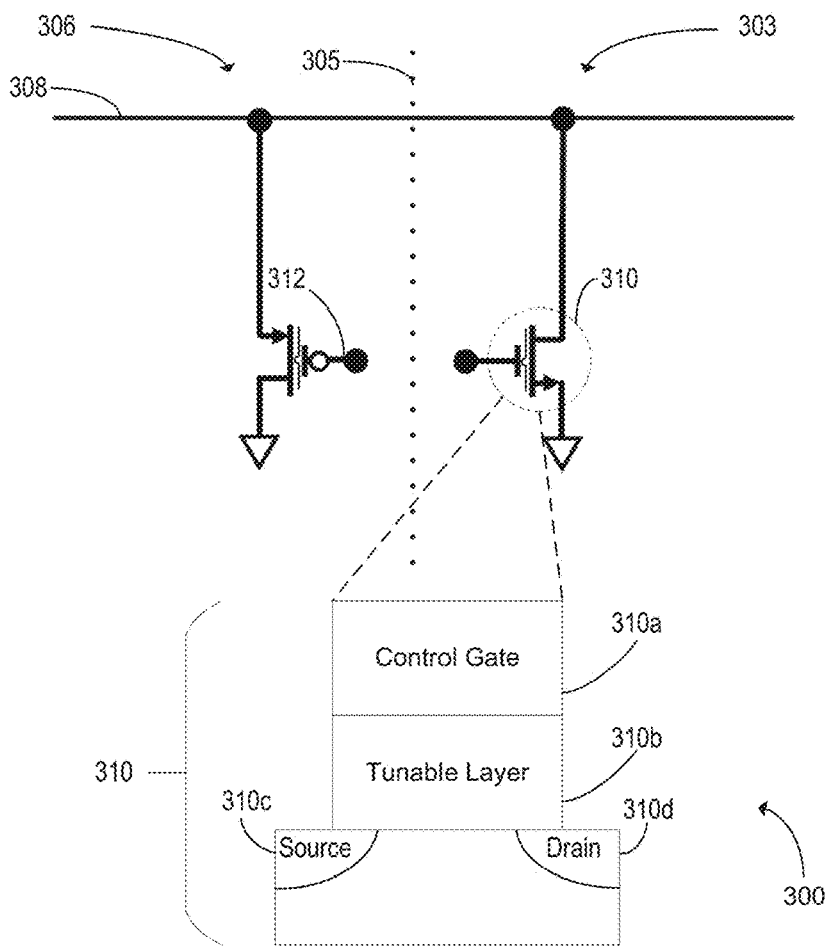
FIG. 3 depicts an analog CAM cell circuit that may be used to implement the analog CAM cells of FIG. 2.

FIG. 3 depicts an electronic circuit implementing an aCAM cell 300 that may be used to implement the aCAM cells 205 of FIG. 2 in some examples. The aCAM cell 300 includes a "high side" 303 (the right side of dividing line 305) and a "low side" 306 (the left side of dividing line 305), so-called because the memory device M1 and the memory device M2 of FIG. 2 may be programmed to determine the values of the high voltage bound and the low voltage bound, respectively.

The high side 303 may include a first three terminal memory device 310. The low side 306 may include a second three terminal memory device 312. In this example, the three terminal memory devices 310 and 312 may be referred to herein as three terminal transistors. However, it is understood that other three-terminal memory devices may be implemented. The second three terminal transistor 312 may include similar architecture to transistor 310, including a control gate 310a, a tunable layer 310b, and source and drain terminals, 310c and 310d respectively. Control gate 310a may receive a voltage, such that, where the voltage surpasses a voltage threshold of transistor 310 and/or 312, transistor 310 and/or 312 may be turned "ON." In other words, transistor 310 and/or 312 may be flipped to a conductive state (i.e. a current may flow between source 310c and drain 310d).

Tunable layer 310b may tune or otherwise shift the voltage threshold of transistor 310 and/or 312. For example, transistors 310 and/or 312, in some implementations, may be ionic floating-gate memories. In this example, tunable layer 310b may be a floating gate, e.g. to implement a "Flash" cell, and may be charged to a predetermined level for tuning the threshold voltage of the transistor 310. Specifically, a greater charge at floating gate 310b may screen the electric field generated by transistor 310 and/or 312 from control gate 310a, which may result in a greater threshold voltage to be applied at control gate 310a to flip transistor 310 and/or 312 to a conductive state.

In some example implementations, three terminal memory devices 310 and/or 312 may be Field Effect Transistors (FETs), such as Ferroelectric Field Effect Transistors (FeFETs). In this example implementation, tunable layer 310b may be a ferroelectric layer that may be charged such that the resultant polarization shifts the threshold voltage of transistor 310 and/or 312. In this implementation, the Ferroelectric material may be continually tuned to dynamically control the threshold voltage of transistors 310 and/or 312.

Figure 4:
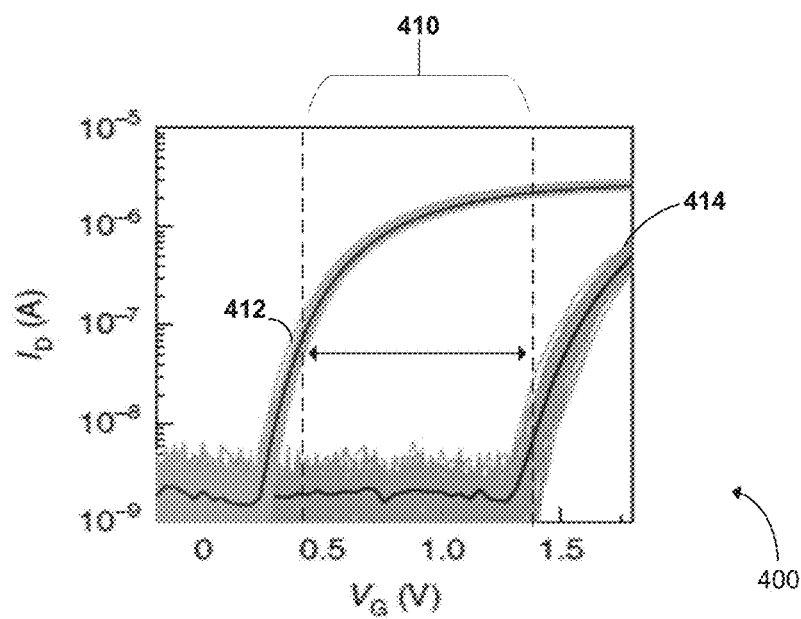
FIG. 4 depicts an example graph representing an example range for tuning the threshold voltage of a three terminal memory device.

Turning to FIG. 4, an example graph 400 is illustrated representing an example range 410 for tuning the threshold voltage of transistor 310 and/or 312. For example, the lower voltage bound may be tuned to an intermediate voltage that is greater than a fully-erased state 412. In another example implementation, the higher voltage bound may be tuned to an intermediate voltage that is less than a fully-programmed state 414.

Here, the "fully-erased" or "fully-programmed" states depend on the tunable mechanism. For example, where a FeFET is implemented, the range may span the polarization charge in the ferroelectric material of the transistor. In another example, a Flash device may be implemented in which the transistor includes a floating gate as described above. In this implementation, the range from "fully-erased" to "fully-programmed" state may span the fully charged to fully uncharged states of the floating gate.

In this illustrated example, the "fully-programmed" state 414 roughly corresponds to a turn-on voltage of 1.5 Volts, and the "fully-erased" state 412 roughly corresponds to a turn-on voltage of 0.05 Volts. Any intermediate state may, for the purposes of this example, be within the range 410 dictated by the turn on voltage of the "fully-erased" state (lower bound) and the turn on voltage of the "fully-programmed" state (upper bound). It is understood that these voltages are merely exemplary and a number of different voltage ranges may be implemented depending on the memory device implemented as described above.

Turning back to FIG. 3, transistor 312, in conjunction with transistor 310, may indicate whether a searched value matches. Specifically, transistor 312 and transistor 310 may indicate whether a search value is within a match range as defined by the threshold voltage tuning of transistors 310 and 312. For example, transistor 310 may be an n-type three terminal transistor that encodes the left range of the analog CAM cell. In other words, transistor 310 may set the upper bound of the predetermined voltage range within which a match occurs. Specifically, an input search value may be received in the form of an input voltage at control gate 310a. If the input voltage is less than the threshold voltage of transistor 310—as determined by tunable layer 310b described above—transistor 310 is not turned "ON", and no current flows between source 310c and drain 310d. In this instance, transistor 310 does not pull down match line 308.

Conversely, transistor 312 may be a p-type three terminal transistor that encodes the right range of the analog CAM cell. In other words, transistor 312 may set the lower bound of the predetermined voltage range within which a match occurs. Like transistor 310, transistor 312 may receive the input search value. If the input voltage is greater than the threshold voltage of transistor 312, transistor 312 is not turned "ON." In this instance, transistor 312 does not pull down match line 308.

Accordingly, if the input search value is a voltage within the range determined by transistors 310 and 312, then match line 308 remains high, i.e. charged. Example match line 308 may be, for purposes of this example, a segment of ML1 or ML2 as described above with respect to FIG. 2. Additionally, the input search value received by transistor 310 and 312 may be received, for example, from DL1 or DL2 as described above with respect to FIG. 2.

Figure 5:
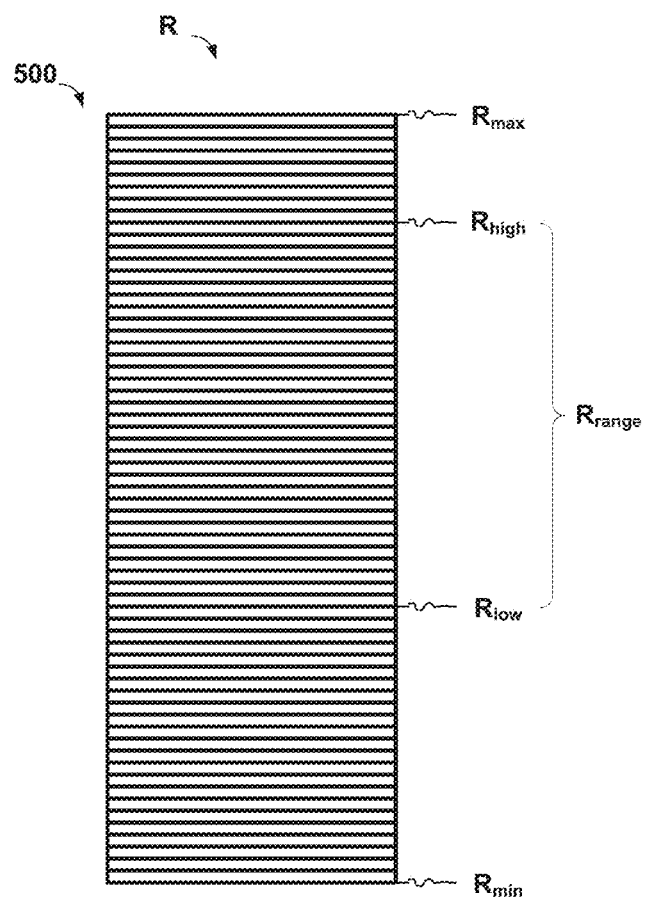
FIG. 5 conceptually illustrates a resistance differential that may be used to set the stored analog value of the analog CAM cells in FIG. 2 in some examples.

FIG. 5 conceptually illustrates a resistance differential 500 that may be used to set the stored analog value or range of the aCAM cells 205 in FIG. 2 in some examples. When an analog value is stored, the analog number is encoded in the cell via two voltage thresholds, a high and a low voltage threshold, $V_{high}$ and $V_{low}$ respectively, within which the analog value of the cell (or range of voltage $V_{range}$) resides. Several electronic circuits by which the aCAM cells 205 may be implemented will be discussed further below. In the examples described below, the three terminal memory devices T7 and/or T8 of FIGS. 6-9 may have an effective resistive $r=I_{ds}/dV_{ds}$, where $I_{ds}$ is a drain-source current at the memory device and $V_{ds}$ is a drain-source voltage at the memory device. As illustrated, $R_{low}$ and $R_{high}$ may be the effective resistance of a "low side" and "high side" of an aCAM cell respectively, as further described herein. Thus, the effective resistance of each of memory devices T7 and/or T8 may span a range of values between $R_{min}$ and $R_{max}$ as illustrated at resistance differential 500.

Figure 6:
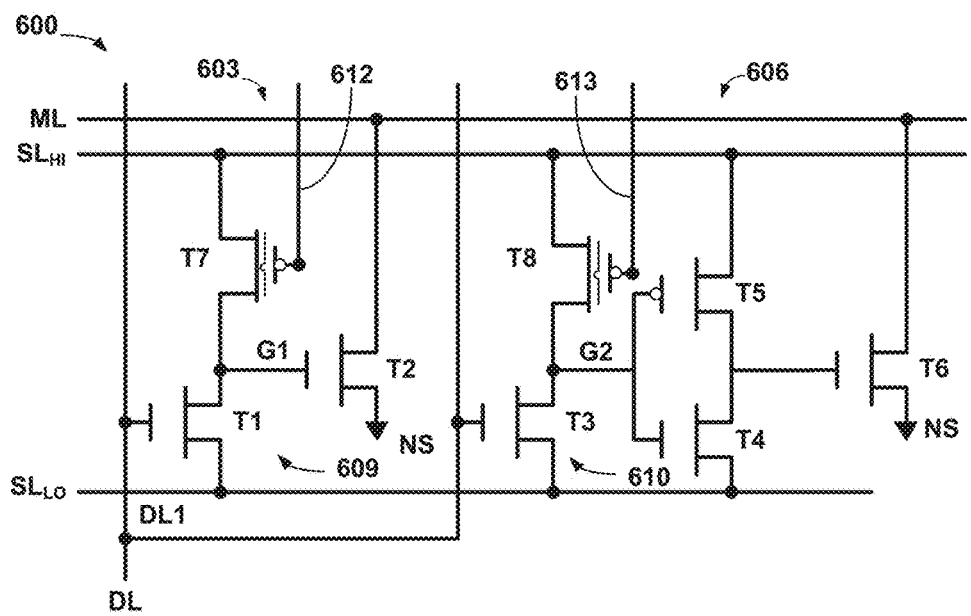
FIG. 6 depicts an example analog CAM cell circuit that may be used to implement the analog CAM cells of FIG. 2 in some examples.

FIG. 6 depicts an example electronic circuit implementing an aCAM cell 600. The aCAM cell 600 may be used to implement, for example, the aCAM cells 205 of FIG. 2. The aCAM cell 600 may include a "low side" 603 and a "high side" 606, so-called because the three terminal memory device T7 and the three terminal memory device T8 are programmed to set the low bound voltage $V_{low}$ and the high bound voltage $V_{high}$ of a voltage range $V_{range}$ for determining if an input voltage to DL, $V_{DL}$, will be a match (ML remains high), or a mis-match (ML is discharged to ground). Specifically, memory devices T7 and/or T8 may be programmed to set a respective threshold voltage for memory devices T7 and/or T8. The threshold voltage for memory devices T7 and/or T8 are correlated with an effective resistance of T7 and/or T8 respectively, and the effective resistance of T7 and/or T8 is directly correlated with the low bound voltage and/or the high bound voltage respectively. Thus, a programming of the threshold voltages for memory devices T7 and T8 may determine the low bound voltage and high bound voltage respectively, and a match for the aCAM cell 600 may occur if $V_{low} \le V_{DL} \le V_{high}$. Otherwise, a mismatch may be indicated.

The low side 603 includes a first transistor T1 and a first three terminal memory device T7. The three terminal memory device T7, in conjunction with the first transistor T1, defines a first voltage divider 609 and, when programmed, defines a low value $V_{low}$ of a range of values $V_{range}$ as described above. The low side 603 further includes a second transistor T2 that, in use, indicates whether a searched value is above the low value $V_{low}$ as discussed further herein.

The high side 606 includes a third transistor T3 and the second three terminal memory device T8. The second three terminal memory device T8, in conjunction with the third transistor T3, defines a second voltage divider 610. When the second three terminal memory device T8 is programmed, the memory device T8 defines the high value $V_{high}$ of the range of values $V_{range}$ as described above. The high side 606 also includes another memory device T6 that, in use, indicates whether the searched value is below the high value $V_{high}$. In this example, high side 606 further includes an example inverter formed by transistors T4 and T5. Note that, although the T4/T5 inverter is at the high side 606 in the illustrated example, it may be implemented at the low side 603 in other examples.

Three terminal memory devices T7 and T8 may include similar architecture to the three terminal transistors 310 and 312 described above with respect to FIG. 3. For instance, three terminal memory devices T7 and T8 may be non-volatile memory devices and may be transistors. Furthermore, three terminal memory devices T7 and T8 may include control gate 310a, tunable layer 310b, and/or source 310c and drain 310d. Memory devices T7 and T8 may be tuned or otherwise biased to set the voltage threshold of memory device T7 and/or T8 respectively. In this example implementation, the threshold voltage of each of memory devices T7 and T8 may be set by programs lines 612 and 613 respectively. For example, memory devices T7 and/or T8, in some implementations, may be Flash devices comprising floating-gate transistors having floating gates. The floating gates may be charged by program lines 612 and 613 respectively to a particular level for setting the threshold voltage of the respective transistor. In this way, the Flash devices may be continually tuned to dynamically control the threshold voltage of memory devices T7 and/or T8 which dynamically sets the desired $V_{range}$ of aCAM cell 600. In some examples, the voltage applied at the floating gate of the first transistor may be a predetermined fixed value between 0 and a voltage at a drain of the first transistor. Similarly, the voltage applied at the floating gate of the second transistor may be a predetermined fixed value between 0 and a voltage at a drain of the second transistor.

In some example implementations, memory devices T7 and/or T8 may be Field Effect Transistors (FETs), such as Ferroelectric Field Effect Transistors (FeFETs) having ferroelectric layers that may be charged to set the threshold voltage of memory devices T7 and/or T8. In this way, the Ferroelectric material may be continually tuned to dynamically control the threshold voltage of memory devices T7 and/or T8 which dynamically sets the desired $V_{range}$ of aCAM cell 600. In this example, memory devices T7 and/or T8 may be p-type FeFET transistors which ensures that the voltages at memory devices T7 and/or T8 remain constant during the search operation. In some examples, the voltage applied at the ferroelectric layer of the first transistor may be a predetermined fixed value between 0 and a voltage at a drain of the first transistor. Similarly, the voltage applied at the ferroelectric layer of the second transistor may be a predetermined fixed value between 0 and a voltage at a drain of the second transistor.

The aCAM cell 600 also includes a match line ML, search lines $SL_{HI}$, $SL_{LO}$, and data lines DL, DL1. As noted above, pairs T7/T1 and T8/T3 define respective voltage dividers 609 and 610. The voltage dividers 609, 610 are used to encode $V_{high}$ and $V_{low}$ when the memory devices T7 and T8 are programmed at program lines 612 and 613 respectively. Thus, in this example, the analog search for each pair T1/T7 and T3/T8 is implemented at the gate voltage of transistors T1 and T3 to create variable-resistor dividers.

More particularly, memory device T7 and transistor T1 form a voltage divider 609, in which T7 is a memory device, such as a three terminal transistor, with a tunable voltage threshold, and T1 is a transistor whose resistance increases with the input voltage on the data line DL. Therefore, there exists a programmable threshold voltage at T7, and, when the data line DL input voltage is smaller than the threshold, the pull-down transistor T2 turns on which pulls down the match line ML yielding a 'mismatch' result. Similarly, memory device T8 and transistor T3 form another voltage divider 610, and the internal voltage node is inverted by the transistors T4, T5 before applying to another pull-down transistor T6. As a result, with properly programmed voltage thresholds at the three terminal memory devices T7 and T8, the aCAM cell 600 keeps the match line ML high only when the voltage on the data line DL is within a certain range defined by the programmed T7 and T8 voltage thresholds. Conversely, when the voltage on the data line DL is outside the defined range, T6 turns on which pulls down the match line ML yielding a "mismatched" search result.

The relationship between the search voltage range and the three terminal memory device voltage thresholds can be better understood by the voltage divider effect from the series connected transistors and T7/T1 at the "low side" 603 of FIG. 6. During the operation, the transistors T1, T2 are mostly working in a triode regime as the voltage drop across the transistor channel is fairly small. Under this condition, one derives that the match line is pulled down (i.e. a mismatch) only when the VDL roughly follows the following equation, while a more accurate relation may be acquired by numerical simulations:

$$V_{DL} \gtrsim G_{V1} \cdot (V_{SLHI}/V_{TH,ML} - 1)/\beta + V_{TH}$$

where $V_{TH}$ and $V_{TH,ML}$ are the threshold voltages of the transistor in the voltage divider and the transistor which discharges or pulls down the ML respectively, and $\beta$ is a constant coefficient. $G_{V1}$ is the effective conductance (I/V) of three terminal memory devices T7 when a fixed voltage is applied to a respective gate terminal of memory device T7, where I is the current flowing through the channel of a respective memory device T7 and V is voltage drop across the respective memory device T7. Because of the inverter formed by T4 and T5 of FIG. 6, a similar inverted equation for that shown above may apply to the "high side" 606 and voltage divider effect from the series connected transistors and T8/T3 of FIG. 6.

The aCAM cell 600 will output a match result when:

$$f(G_{V1}) < V_{DL} < f(G_{V2}),$$

where $r(G_{V1})$, and $f(G_{V2})$ are the voltages at G1, G2, respectively, in FIG. 6.

Figure 7:
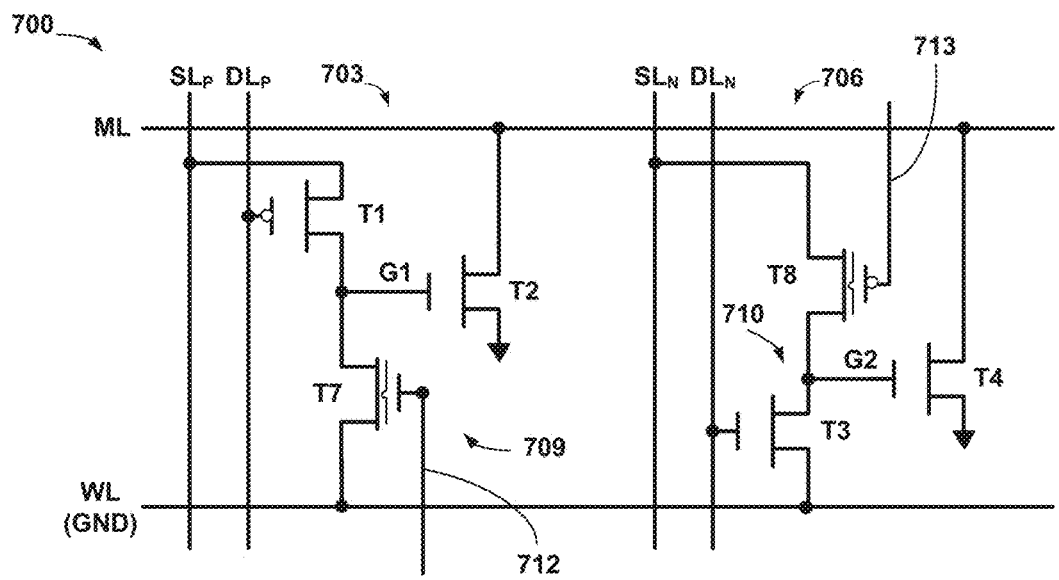
FIG. 7 depicts another example analog CAM cell circuit that may be used to implement the analog CAM cells of FIG. 2 in some examples.

FIG. 7 depicts another example implementation of an electronic circuit for an aCAM cell 700 that may be used to implement the aCAM cells 205 of FIG. 2 in some examples.

FIG. 7 may include similar example components to those described above with respect to FIG. 6, including transistors T1-T6, memory devices T7-T8 and match line ML. Like the example aCAM cell 200 of FIG. 2, aCAM cell 700 may include a "high side" 703 and a "low side" 706, so-called because three terminal memory devices T7 and T8 are programmed to determine a high bound voltage threshold and a low bound voltage threshold, respectively. Specifically, T7 and T8 may be programmed by driving each respective memory device with a fixed and predetermined ON voltage during search operations at program lines 712 and 713 respectively. This voltage may drive the tunable layer of the memory device, e.g. tunable layer 310b of FIG. 3. For instance, where memory devices T7 and/or T8 are floating gate transistors, the predetermined voltage may drive the level of charge at the tunable layer of each transistor respectively. As another example, where memory devices T7 and/or T8 are Field Effect Transistors, the predetermined voltage may drive the polarization of the transistors respectively.

The high side 703 includes transistor T1 and a non-volatile programmable three terminal memory device T7. Memory device T7, in conjunction with transistor T1, defines a first voltage divider 709 for the voltage applied on $SL_P$ and, when programmed, i.e. by program line 712, memory device T7 defines a high value $V_{high}$ of a range of values $V_{range}$. The high side 703 also includes a second transistor that, in use, indicates whether a searched value matches the high value $V_{high}$ as discussed further below. The low side 706 includes transistor T3 and a non-volatile programmable three terminal memory device T8. Memory device T8, in conjunction with transistor T3, defines a second voltage divider 710. When three terminal memory device T8 is programmed, i.e. by program line 713, transistor T8 defines the low value $V_{low}$ of the range of values $V_{range}$. The low side 706 also includes a fourth transistor T4 that, in use, indicates whether the searched value matches the low value $V_{low}$.

The aCAM cell 700 also includes a match line ML, a word line WL that serves as a ground, search lines $SL_P$, $SL_N$, and data lines $DL_P$, $DL_N$. As noted above, the pairs T7/T1 and T8/T3 define a respective voltage divider 709, 710. The three terminal memory devices T7, T8 of the voltage dividers 709, 710 are used to encode $V_{high}$ and $V_{low}$ when the voltage thresholds of memory devices T7, T8 are programmed via program lines 712 and 713 respectively. (Whether the searched data matches the stored data is a function of the voltage divider (the T7/T8 voltage thresholds as programmed)). Thus, in this example, in each pair T7/T1 and T8/T3, the analog search is implemented at the gate voltage of transistors T1 and T3 to create variable-resistor dividers.

On the high side 703, where $V_{high}$ is programmed, $V_{search}$, i.e. the search voltage on data line $DL_P$, should be low enough such that the voltage at G1 (created by the voltage divider between T1 and T7) does not turn "ON" the T2 pulldown transistor. If $DL_P$ is too high (indicating a search value above the $V_{high}$ bound), then T1 is low resistance, and thus the voltage at G1 will be similar to the search voltage on $SL_P$, and therefore quite high causing T2 to turn "ON" and discharge the pre-charged voltage on the ML, indicating a mismatch. On the low side 706, $V_{search}$ on $DL_N$ should be high enough such that the voltage at G2 (created by the voltage divider between T8 and T3) is fairly low and does not turn "ON" the pulldown transistor T4. If $DL_N$ is too low (indicated a search value below the $V_{low}$ bound), then T3 is high resistance, therefore the voltage on G2~$SL_n$ search voltage, causing a mismatch and discharge similar to as noted above. This example uses an inverse mapping of the desired analog search value onto low and high gate voltages for T1 and T3 lines. So, for instance: $SL_P$=$SL_N$=0.8V, $DL_P$=0V, $DL_N$=1.5V. Example states of T7 and T8 are illustrated at FIG. 4.

Note that any combination of the transistors T1-T6 and memory devices T7-T8 may be implemented using metal-oxide semiconductor field-effect transistors ("MOSFETs"). In this example, T1 is a positive or "p" MOSFET and T3 is a negative or "n" MOSFET. This in turn, offers potential for more analog levels relative to examples in which T1 and T3 are both "n" MOSFETs with the memristor/transistors pairs reversed. These and other advantages arising from the circuit design will become apparent to those skilled in the art having the benefit of this disclosure.

The example aCAM cell 700 in FIG. 7 offers many "tuning knobs" for adjusting cell performance: the voltages on $DL_P$, $DL_N$, $SL_P$, $SL_N$, and the programmed voltage thresholds of T7 and T8, for instance. The source as GND for T1 and T2 pulldown transistors can also be changed to a global nonzero voltage value to help tune cases of near-matches. Still other tuning knobs, or sources for adjustment, may become apparent to those skilled in the art having the benefit of this disclosure.

Figure 8:
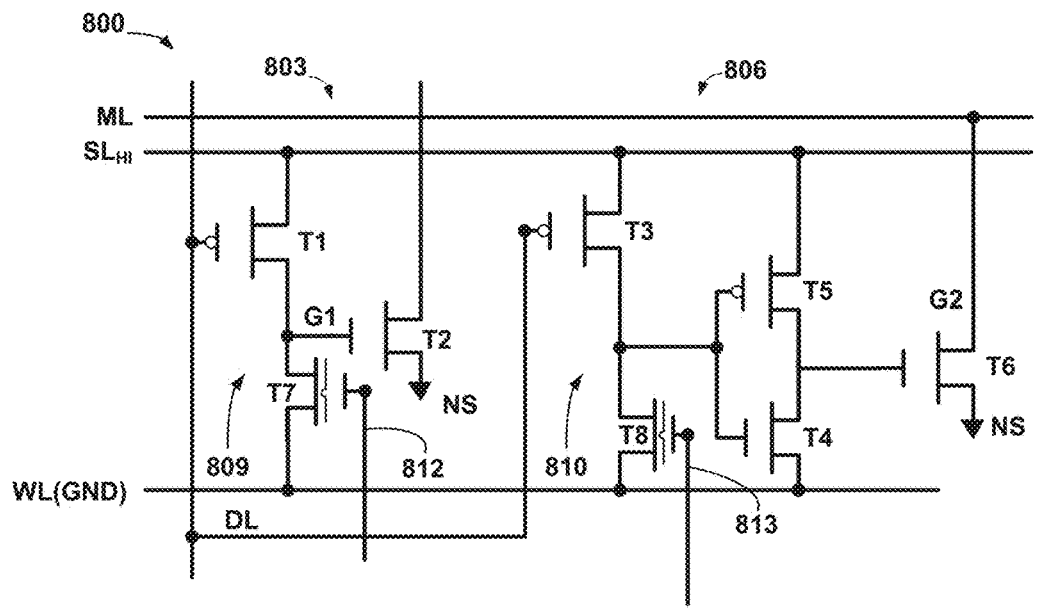
FIG. 8 depicts yet another example analog CAM cell circuit that may be used to implement the analog CAM cells of FIG. 2 in some examples.

FIG. 8 depicts another example electronic circuit implementing an aCAM cell 800. The aCAM cell 800 may be used to implement, for example, the aCAM cells 205 of FIG. 2. The aCAM cell 800 may include similar components to those described above with respect to FIG. 6. Like the aCAM cell 600 of FIG. 6, aCAM cell 800 may include a "high side" 803 and a "low side" 806, so-called because the three terminal memory device T7 and the three terminal memory device T8 are programmed to determine the high bound voltage threshold and the low bound voltage threshold of a threshold range for determining an input match.

Like, aCAM cell 600, aCAM cell 800 may include transistors T1-T6 and memory devices T7-T8. For instance, the high side 803 may include first transistor T1 and first three terminal memory device T7, where memory device T7 in conjunction with transistor T1 define a first voltage divider 809, and, when programmed, define a high value $V_{high}$ of a range of values $V_{range}$. The high side 803 further includes a second transistor T2 that, in use, indicates whether a searched value matches the high value $V_{high}$ as discussed further herein. Similarly, the low side 806 includes transistor T3 and memory device T8, which together define a second voltage divider 810. Men memory device T8 is programmed, memory device T8 defines the low value $V_{low}$ of the range of values $V_{range}$. The low side 806 also includes another transistor T6 that, in use, indicates whether the searched value matches the low value $V_{low}$. In this example, low side 806 further includes an example inverter formed by transistors T4 and T5. Note that, although the T4/T5 inverter is at the low side 806 in the illustrated example, it may be implemented at the high side 803 in other examples.

However, unlike example aCAM cell 600, three terminals memory devices T7 and T8 in this example may be n-type transistors. For example, three terminals memory devices T7 and T8 may be n-type FeFETs, and transistors T1 and T3 may be p-type transistors. Like in previous examples, the threshold voltage of each of memory devices T7 and T8 may be set by programs lines, in this instance program lines 812 and 813 respectively.

The aCAM cell 800, like aCAM cell 600 of FIG. 6, may also include match line ML and search lines $SL_{HI}$. The aCAM cell 800 may further include word line WL that serves as a ground, and data line DL which may carry an input search value. As described above with respect to FIG. 6, pairs T7/T1 and T8/T3 may define respective voltage dividers, in this instance voltage dividers 809 and 810. The voltage dividers 809, 810 are used to encode $V_{high}$ and $V_{low}$ when the memory devices T7 and T8 are programmed at program lines 812 and 813 respectively. Thus, in this example, in each pair T1/T7 and T3/T8, the analog search is implemented at the gate voltage of transistor T1 and T3 to create variable-resistor dividers.

More particularly, memory device T7 and transistor T1 form a voltage divider 809, in which T7 may be a transistor with a tunable voltage threshold and T1 is a transistor whose resistance increases with the input voltage on the data line DL. Therefore, there exists a programmable threshold voltage at T7, and, when the data line DL input voltage is smaller than the threshold, the pull-down transistor T2 turns on which pulls down the match line ML yielding a 'mismatch' result. Similarity, memory device T8 and transistor T3 form another voltage divider 810, and the internal voltage node is inverted by the transistors T4, T5 before applying to another pull-down transistor T6. As a result, with properly programmed voltage thresholds at the three terminal memory devices T7 and T8, the aCAM cell 800 keeps the match line ML high when the voltage on the data line DL is within a certain range defined by the programmed T7 and T8 voltage thresholds. Conversely, when the voltage on the data line DL is outside the defined range, ML is pulled down and a mismatched search results.

Figure 9:
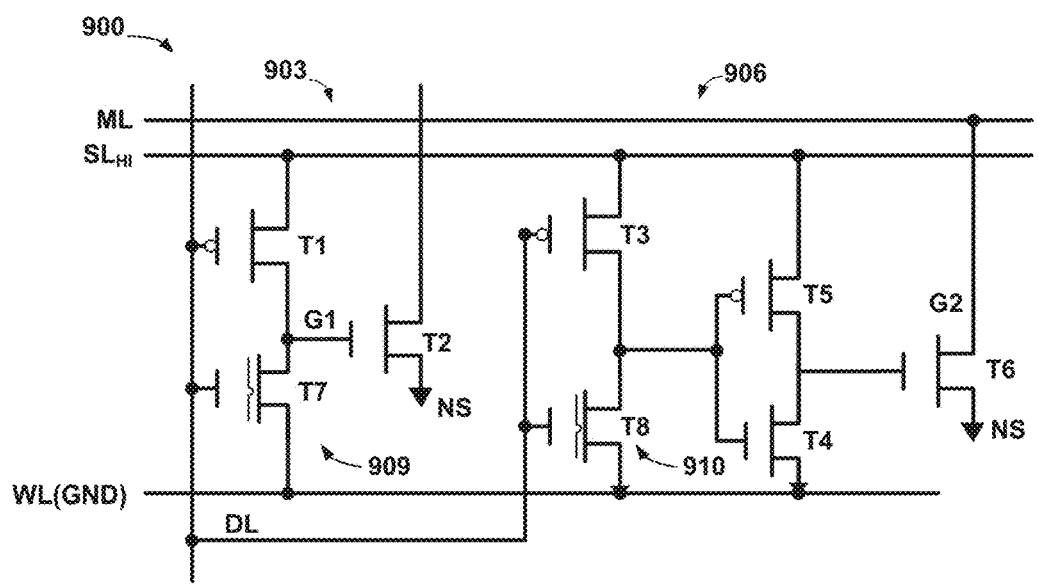
FIG. 9 depicts a further example analog CAM cell circuit that may be used to implement the analog CAM cells of FIG. 2 in some examples.

FIG. 9 depicts another example electronic circuit implementing an aCAM cell 900. The aCAM cell 900 may be used to implement, for example, the aCAM cells 205 of FIG. 2. The aCAM cell 900 may include similar components to those described above with respect to FIG. 8. Like the aCAM cell 800 of FIG. 8, aCAM cell 900 may include a "high side" 903 and a "low side" 906. Like, aCAM cell 800, aCAM cell 900 may include transistors T1-T6 and memory devices T7-T8. Like aCAM cell 800 of FIG. 8, pairs T7/T1 and T8/T3 may define respective voltage dividers at high side 903 and low side 906 respectively. In this instance, T7/T1 and T8/3 form voltage dividers 909 and 910 respectively. As described above, the voltage dividers 909, 910 are used to encode $V_{high}$ and $V_{low}$ when the memory devices T7 and T8 are programmed.

The aCAM cell 900, like aCAM cell 800 of FIG. 8, may also include match line ML and search lines $SL_{HI}$, as well as word line WL and data line DL. Unlike memory devices T7/T8 of aCAM cell 800, memory devices T7/T8 of FIG. 9 may be tied to data line DL. For example, memory devices T7/T8 of FIG. 9 may be programmed by data line DL instead of by program lines 812 and 813 as described above with respect to FIG. 8. Programming memory devices T7/T8 via data line DL may enable a smaller leakage of static current from $SL_{HI}$ to world line WL. Additionally, during the search, transistor T1 and memory device T7 form a CMOS-like inverter, instead of an NMOS-inverter as exemplified in FIG. 6-FIG. 8. This CMOS-like inverter may enable a sharper inversion curve between the voltage on data line DL and the voltage at G1, allowing for more bits, i.e. more discrete voltage levels at data line DL that may be searched and stored by the aCAM. In order to avoid perturbing the states of T7/T8, the search voltage on the DL may be maintained below a threshold.

This concludes the detailed description. The particular examples disclosed above are illustrative only, as examples described herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the appended claims. Accordingly, the protection sought herein is as set forth in the claims below.

What is claimed is:

1. An analog content addressable memory cell, comprising:
    a match line having a charge;
    a high side encoding a high voltage bound on a range of values, the high side including an at least three terminal first memory device, wherein the first memory device is at least one of a first floating-gate Metal-Oxide-Semiconductor Field-Effect Transitor (MOSFET) or a first Ferroelectric Field-Effect Transistor (FeFET), wherein at least one of the three terminals includes a first gate, and wherein an input voltage applied at the first gate of the first memory device, if higher than the high voltage bound, turns the first memory device ON which discharges the match line; and
    a low side encoding a low voltage bound on a range of values, the low side including an at least three terminal second memory device, wherein the second memory device is at least one of a second floating-gate Metal-Oxide-Semiconductor Field-Effect Transitor (MOSFET) or a second Ferroelectric Field-Effect Transistor (FeFET), wherein at least one of the three terminals includes a second gate, and wherein the input voltage applied at the second gate of the second memory device, if lower than the low voltage bound, turns the second memory device ON which discharges the match line.

2. The analog content addressable memory cell of claim 1, wherein the three terminal first memory device and the three terminal second memory device are floating-gate Metal-Oxide-Semiconductor Field-Effect Transistors (MOSFETs).

3. The analog content addressable memory cell of claim 2, wherein the high voltage bound may be tuned by a first charge applied at a first floating gate of the first memory device and the low voltage bound may be tuned by a second charge applied at a second floating gate of the second memory device.

4. The analog content addressable memory cell of claim 1, wherein the three terminal first memory device and the three terminal second memory device are Ferroelectric Field-Effect Transistors (FeFETs).

5. The analog content addressable memory cell of claim 4, wherein the high voltage bound may be tuned by a first polarization charge applied at a first ferroelectric layer of the first memory device and the low voltage bound may be tuned by a second polarization charge applied at a second ferroelectric layer of the second memory device.

6. The analog content addressable memory cell of claim 1, wherein the match line is pre-charged.

7. The analog content addressable memory cell of claim 6, wherein the match line remains charged when the applied input voltage is lower than the high voltage bound and higher than the lower voltage bound.

8. The analog content addressable memory cell of claim 7, wherein the match line indicates a match where the match line remains charged after the input voltage is applied.

9. An analog content addressable memory, comprising:
a plurality of input voltages by which an input pattern may be loaded in use; and
an analog memory cell array to receive the plurality of input voltages, each cell of the analog memory cell array including:
a high side encoding a high voltage bound, the high side including an at least three terminal first memory device, wherein the first memory device is at least one of a first floating-gate Metal-Oxide-Semiconductor Field-Effect Transitor (MOSFET) or a first Ferroelectric Field-Effect Transistor (FeFET), wherein at least one of the three terminals includes a first gate, and wherein an input voltage of the plurality of input voltages is applied at the first gate of the first memory device, wherein if the input voltage is higher than the high voltage bound, the first memory device is turned ON which discharges a match line of the analog memory cell; and
a low side encoding a low voltage bound on a range of values, the low side including an at least three terminal second memory device, wherein the second memory device is at least one of a second floating-gate Metal-Oxide-Semiconductor Field-Effect Transitor (MOSFET) or a second Ferroelectric Field-Effect Transistor (FeFET), wherein at least one of the three terminals includes a second gate, and wherein the input voltage of the plurality of input voltages is applied at the second gate of the second memory device, wherein if the input voltage is lower than the low voltage bound, the second memory device is turned ON which discharges the match line.

10. The analog content addressable memory of claim 9, further comprising at least one of:
a search data register into which a digital input pattern may be loaded in use via the inputs; and
an encoder that generates a match location for the analog input pattern within the analog memory cell array.

11. The analog content addressable memory of claim 9, wherein the match line is pre-charged.

12. The analog content addressable memory cell of claim 9, wherein the first memory device and second memory device are Ferroelectric Field-Effect Transistors (FeFETs) and the input voltage applied at the first and second memory device is a predetermined polarization value.

13. The analog content addressable memory cell of claim 9, wherein the three terminal first memory device and the three terminal second memory device are floating-gate Metal-Oxide-Semiconductor Field-Effect Transistors (MOSFETs) and the input voltage applied at the first and second memory device applies a predetermined bias to the first and second memory device.

14. An analog content addressable memory cell, comprising:
a match line having a charge;
at least one data line to carry an input voltage;
a high side encoding a high voltage bound on a range of values, the high side including an at least three terminal first programmable memory device, wherein the first memory device is at least one of a first floating-gate Metal-Oxide-Semiconductor Field-Effect Transitor (MOSFET) or a first Ferroelectric Field-Effect Transistor (FeFET), wherein at least one of the three terminals includes a first gate, and wherein a first voltage applied at the first gate, if higher than the high voltage bound, turns the first memory device ON which pulls down the match line; and
a low side encoding a low voltage bound on a range of values, the low side including an at least three terminal second programmable memory device, wherein the second memory device is at least one of a second floating-gate Metal-Oxide-Semiconductor Field-Effect Transitor (MOSFET) or a second Ferroelectric Field-Effect Transistor (FeFET), wherein at least one of the three terminals includes a second gate, and wherein a second voltage applied at the second gate; if lower than the low voltage bound, turns the second memory device On which pulls down the match line.

15. The analog content addressable memory cell of claim 14, wherein the high side and the low side share a single data line of the at least one data line.

16. The analog content addressable memory cell of claim 15, wherein the shared single data line programs the first and second gate of the first and second memory device.

17. The analog content addressable memory cell of claim 15, wherein the first memory device and second memory device are Ferroelectric Field-Effect Transistors (FeFETs) and the input voltage applied at the first and second memory device is a predetermined polarization value.

18. The analog content addressable memory cell of claim 14, wherein the voltage applied at the first gate and the voltage applied at the second gate are fixed values between 0 and a voltage at a drain of the first memory device or a voltage at a drain of the second memory device.

19. The analog content addressable memory cell of claim 14, wherein the match line is pre-charged.

20. The analog content addressable memory cell of claim 14, wherein at least one of the low side and the high side includes an inverter.

* * * * *